United States Patent
Pu et al.

(10) Patent No.: US 11,417,650 B2
(45) Date of Patent: Aug. 16, 2022

(54) INTEGRATED CIRCUIT AND METHOD OF MANUFACTURING SAME

(71) Applicant: Powerchip Semiconductor Manufacturing Corporation, Hsinchu (TW)

(72) Inventors: Shih-Chieh Pu, New Taipei (TW); Jih-Wen Chou, Hsinchu (TW); Chih-Chung Tai, Chiayi (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 186 days.

(21) Appl. No.: 16/925,308

(22) Filed: Jul. 9, 2020

(65) Prior Publication Data
US 2021/0351179 A1 Nov. 11, 2021

(30) Foreign Application Priority Data
May 8, 2020 (TW) ................................ 109115449

(51) Int. Cl.
*H01L 27/088* (2006.01)
*H01L 21/8234* (2006.01)

(52) U.S. Cl.
CPC ...... *H01L 27/088* (2013.01); *H01L 21/82345* (2013.01)

(58) Field of Classification Search
CPC .......................... H01L 27/088; H01L 21/82345
See application file for complete search history.

(56) References Cited

U.S. PATENT DOCUMENTS

| | | | |
|---|---|---|---|
| 6,010,929 A | 1/2000 | Chapman | |
| 6,777,761 B2 | 8/2004 | Clevenger et al. | |
| 8,710,567 B2 | 4/2014 | Moriya | |
| 9,985,129 B2 | 5/2018 | Hsiao et al. | |
| 10,050,033 B1 | 8/2018 | Thei et al. | |

(Continued)

FOREIGN PATENT DOCUMENTS

| | | |
|---|---|---|
| TW | 434707 | 5/2001 |
| TW | I257655 | 7/2006 |

OTHER PUBLICATIONS

"Office Action of Taiwan Counterpart Application", dated Jul. 9, 2021, p. 1-p. 4.

*Primary Examiner* — Victor A Mandala
*Assistant Examiner* — Colleen E Snow
(74) *Attorney, Agent, or Firm* — JCIPRNET

(57) ABSTRACT

An integrated circuit including a substrate, a first semiconductor element, and a second semiconductor element is provided. The substrate has a high voltage region and a low voltage region separated from each other. The first semiconductor element is located in the high voltage region. The first semiconductor element includes a first oxide layer and a first gate. The first oxide layer is embedded in the substrate. The first gate is located on the first oxide layer. The first gate is a polycrystalline gate. The second semiconductor element is located in the low voltage region. The second semiconductor element includes a second oxide layer and a second gate. The second oxide layer is embedded in the substrate. The second gate is located on the second oxide layer. The second gate is a metal gate. A manufacturing method of an integrated circuit is also provided.

18 Claims, 23 Drawing Sheets

(56) References Cited

U.S. PATENT DOCUMENTS

2012/0056191 A1* 3/2012 Endo ............... H01L 29/7787
                                                           257/E29.246
2012/0292708 A1   11/2012  Chen et al.
2021/0265344 A1*  8/2021  Chen ............... H01L 21/76224

* cited by examiner

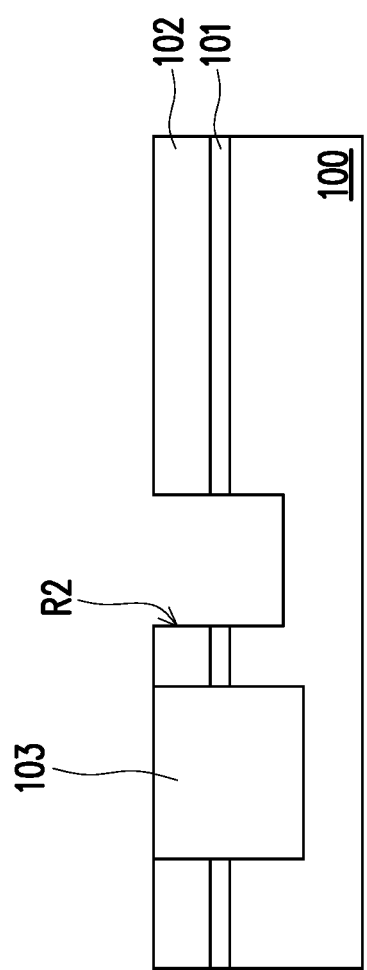

INTEGRATED CIRCUIT AND METHOD OF MANUFACTURING SAME

CROSS-REFERENCE TO RELATED APPLICATION

This application claims the priority benefit of Taiwan application no. 109115449, filed on May 8, 2020. The entirety of the above-mentioned patent application is hereby incorporated by reference herein and made a part of this specification.

TECHNICAL FIELD

The invention relates to a semiconductor device, and more particularly, relates to an integrated circuit and a manufacturing method thereof.

BACKGROUND

In recent years, with the vigorous development of the electronics industry, integrated circuits (IC) have been widely used. In response to the ever-changing needs of the electronics industry, many semiconductor process technologies have also developed rapidly. For example, in the application of system on chip (SoC), there will be different operating voltage requirements for the diversity of electronic elements, such as a low voltage element with high speed and a high voltage element or a memory element with excellent component reliability.

On the other hand, when a metal gate is applied to the high voltage element or the memory element, the metal gate is prone to process limitations due to large-sized gate. For example, in a gate-last process, a planarization (e.g., chemical mechanical polishing process, CMP) used when replacing a dummy gate with the metal gate for large-sized gate is likely to cause a dishing problem, which may stop the elements from operating effectively. In addition, there is currently a gate design method in which large-sized gate is cut into a plurality of independent separation blocks to avoid the dishing problem of the gate that may occur in the gate-last process. However, in this gate design method, these independent separate blocks need to be electrically connected together by a plug and through a metal layer. Consequently, the electrical performance of the integrated circuit is likely to be adversely affected.

SUMMARY

The invention provides an integrated circuit and a manufacturing method thereof, which can meet operating voltage requirements of semiconductor elements on different voltage regions, so that they can prove component diversity while maintaining certain performance.

The invention provides an integrated circuit, which includes a substrate, a first semiconductor element, and a second semiconductor element. The substrate has a high voltage region and a low voltage region separated from each other. The first semiconductor element is located in the high voltage region. The first semiconductor element includes a first oxide layer and a first gate. The first oxide layer is embedded in the substrate. The first gate is located on the first oxide layer. The first gate is a polycrystalline gate. The second semiconductor element is located in the low voltage region. The second semiconductor element includes a second oxide layer and a second gate. The second oxide layer is embedded in the substrate. The second gate is located on the second oxide layer. The second gate is a metal gate.

The invention provides a manufacturing method of an integrated circuit, which at least includes the following steps. A substrate is provided, wherein the substrate has a high voltage region, a medium voltage region and a low voltage region separated from each other. An oxide layer is formed on each of the high voltage region, the medium voltage region and the low voltage region, wherein the oxide layer is embedded in the substrate. A polycrystalline material is formed on of the oxide layer of each of the high voltage region, the medium voltage region and the low voltage region. A mask material is formed at least on the high voltage region. At least the polycrystalline material on the low voltage region is removed by the mask material. The mask material is removed. A metal material is formed on the substrate. A planarization is performed on the metal material to form a metal gate at least on the low voltage region.

Based on the above, for the semiconductor elements on the different voltage regions on the integrated circuit having different operating voltage requirements, the gate material in the respective region can be selected correspondingly. For instance, the first gate of the first semiconductor element on the high voltage region may be the polycrystalline gate so that the first semiconductor element has excellent component reliability. The second gate of the second semiconductor element on the low voltage region may be the metal gate so that the second semiconductor element has excellent operating speed. Therefore, the integrated circuit of the invention can meet the operating voltage requirements of the semiconductor elements on the different voltage regions to provide component diversity while maintaining certain performance. In addition, because the first gate of the first semiconductor device on the high voltage region is not the metal gate, the dishing problem caused by the planarization during the formation of the metal gate may be solved. Further, the mask material may be formed to protect the first polycrystalline material on the high voltage region, so that the first polycrystalline material will not be replaced with the metal gate in the subsequent process to make the first gate become the polycrystalline material, and the first gate will not be cut into multiple blocks either. Therefore, the invention can solve the dishing problem on the first gate of the high voltage region while maintaining component diversity, so as to maintain preferable electrical performance.

To make the aforementioned more comprehensible, several embodiments accompanied with drawings are described in detail as follows.

BRIEF DESCRIPTION OF THE DRAWINGS

FIG. 3A to FIG. 3G are partial cross-sectional views showing another manufacturing method of the oxide layer of FIG. 1A.

DETAILED DESCRIPTION

Figure 1A:
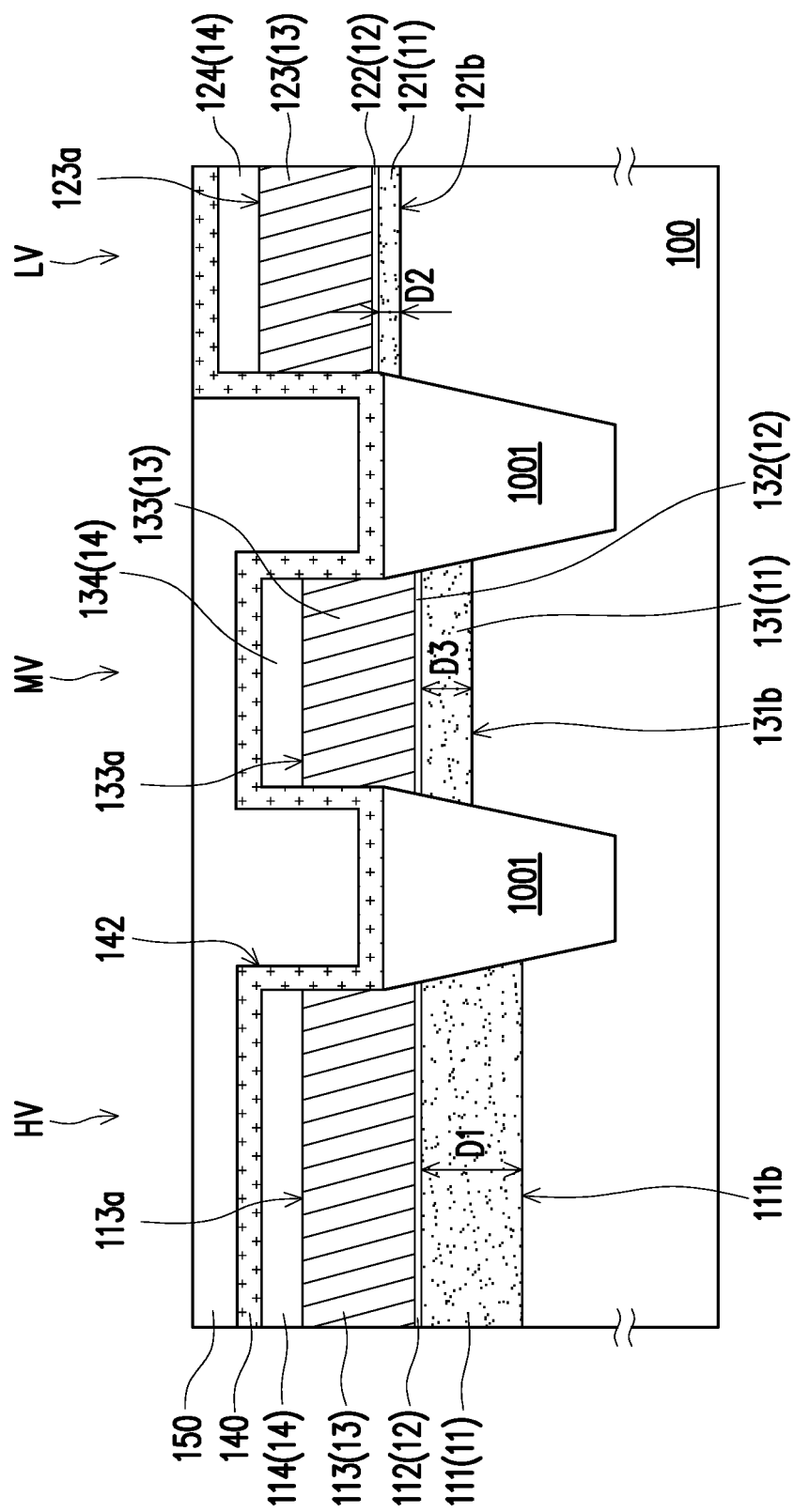
FIG. 1A to FIG. 1D are partial cross-sectional views showing a manufacturing method of parts of an integrated circuit according to an embodiment of the invention.

Directional terminology (e.g., top, down, right, left, front, rear, top, and bottom) is used with reference to the orientation of the Figure(s) being described. As such, the directional terminology is used for purposes of illustration and is in no way limiting.

Unless otherwise clearly indicated, the method in this disclosure should not be construed as requiring steps therein to be performed in a particular order.

The invention will be described more comprehensively below with reference to the drawings for the embodiments. However, the invention may also be implemented in different forms rather than being limited by the embodiments described in the invention. Thicknesses, dimensions and sizes of layers and regions in the drawings are exaggerated for clarity. The same reference numbers are used in the drawings and the description to indicate the same or like parts, which are not repeated in the following embodiments.

FIG. 1A to FIG. 1D are partial cross-sectional views showing a manufacturing method of parts of an integrated circuit according to an embodiment of the invention. In this embodiment, a manufacturing process of an integrated circuit 10 may include the following steps.

Referring to FIG. 1A, a substrate 100 is provided. The substrate 100 may be a semiconductor substrate. For instance, the substrate 100 is, for example, a silicon substrate, but the invention is not limited thereto. Further, the substrate 100 may include a high voltage region HV, a medium voltage region MV and a low voltage region LV separated from each other so that semiconductor elements having different voltage requirements may be respectively formed on those regions later. For instance, the medium voltage region MV may be located between the high voltage region HV and the low voltage region LV.

In one embodiment, the substrate 110 may include a plurality of isolation structures 1001 for separating the high voltage region HV, the medium voltage region MV and the low voltage region LV from each other. The isolation structure 1001 is, for example, a shallow-trench isolation structure, but the invention is not limited thereto.

It should be noted that, the invention does not limit an arrangement manner between the high voltage region HV, the medium voltage region MV and the low voltage region LV, which may be decided depending on actual design requirements. Here, the high voltage region HV is defined as having an operating voltage between positive and negative voltage of 20V to 60V, that is, ±(20V-60V); the medium voltage region MV is defined as having an operating voltage between positive and negative voltage of 3.3V to 18V, that is, ±(3.3V-18V); and the low voltage region LV is defined as having an operating voltage between positive voltage +1.8V and negative voltage −1.8V.

Continuing to refer to FIG. 1A, an oxide layer 11 is formed on each of the high voltage region HV, the medium voltage region MV and the low voltage region LV. The oxide layer 11 may be embedded in the substrate 100. For instance, the oxide layer 11 may include a first oxide layer 111 located on the high voltage region HV, a second oxide layer 121 located on the low voltage region LV and a third oxide layer 131 located on the medium voltage region MV. Here, the oxide layer 11 may be formed by a suitable gate dielectric material and a suitable method, and the invention is not limited thereto.

In one embodiment, the first oxide layer 111, the second oxide layer 121 and the third oxide layer 131 may be completely embedded in the substrate 100. In another embodiment, the first oxide layer 111 and the second oxide layer 121 may be completely embedded in the substrate 100, and the third oxide layer 131 may be partially embedded in the substrate 100, but the invention is not limited thereto.

In one embodiment, in order to allow elements subsequently formed on the oxide layer 11 to reach a desired height, the oxide layer 11 may be formed to include different embedded depths. More specifically, a depth D1 of the first oxide layer 111 embedded in the substrate 100, a depth D3 of the third oxide layer 131 embedded in the substrate 100 and a depth D2 of the second oxide layer 121 embedded in the substrate 100 may be different. For instance, the depth D1 of the first oxide layer 111 embedded in the substrate 100, the depth D3 of the third oxide layer 131 embedded in the substrate 100 and the depth D2 of the second oxide layer 121 embedded in the substrate 100 may gradually decrease in sequence. In other words, a bottom surface 111b of the first oxide layer 111 may be lower than a bottom surface 131b of the third oxide layer 131; and the bottom surface 131b of the third oxide layer 131 may be lower than a bottom surface 121b of the second oxide layer 121. Accordingly, the first oxide layer 111, the third oxide layer 131 and the second oxide layer 121 may form a stepped shape.

In one embodiment, a top surface of the first oxide layer 111 may be coplanar with top surfaces of the second oxide layer 121 and the third oxide layer 131, but the invention is not limited thereto.

Continuing to refer to FIG. 1A, a polycrystalline material 13 is formed on the oxide layer 11 of each of the high voltage region HV, the medium voltage region MV and the low voltage region LV. For instance, the polycrystalline material 13 may include a first polycrystalline material 113 formed on the first oxide layer 111, a second polycrystalline material 123 formed on the second oxide layer 121 and a third polycrystalline material 133 formed on the third oxide layer 131. The polycrystalline material 13 is, for example, polycrystalline silicon, and a formation method thereof is, for example, chemical vapor deposition (CVD), but the invention is not limited thereto.

In one embodiment, a top surface 113a of the first polycrystalline material 113 may be substantially coplanar with a top surface 133a of the third polycrystalline material 133 and lower than a top surface 123a of the second polycrystalline material 123, but the invention is not limited thereto.

In this embodiment, a high dielectric constant material 12 may also be formed between the oxide layer 11 and the polycrystalline material 13 of each of the high voltage region HV, the medium voltage region MV and the low voltage region LV. For instance, the high dielectric constant material 12 may include a first high dielectric constant material 112 included between the first oxide layer 111 and the first polycrystalline material 113, a second high dielectric constant material 122 included between the second oxide layer 121 and the second polycrystalline material 123, and a third high dielectric constant material 132 included between the third oxide layer 131 and the third polycrystalline material 133. The high dielectric constant material 12 is, for example, $HfO_x$, $HfSiO_x$, $HfSiON$, $ZrO_2$, $HfZrO_x$, $AlO_x$ or $TiO_x$ or a combination thereof, but the invention is not limited thereto.

Continuing to refer to FIG. 1A, a first dielectric material 140 is formed comprehensively on the substrate 100 to cover the polycrystalline material 13 on each of the high voltage region HV, the medium voltage region MV and the low voltage region LV. The first dielectric material 140 has a plurality of openings 142. For instance, the first dielectric material 140 is, for example, conformally formed on the substrate 100 to form the openings 142, but the invention is not limited thereto. Then, a second dielectric material 150 may be formed in the openings 142. The first dielectric material 140 is, for example, silicon nitride; and the second dielectric material 150 is, for example, silicon oxide. Their formation method is, for example, chemical vapor deposition (CVD), but the invention is not limited thereto.

In this embodiment, the second dielectric material 150 may cover the first dielectric material 140 on the high voltage region HV and the medium voltage region MV according to a height design of the high voltage region HV, the medium voltage region MV and the low voltage region LV, but the invention is not limited thereto. In one embodiment, a coverage height of the second dielectric material 150 is, for example, between 100 A and 300 A (angstrom), but the invention is not limited thereto.

In addition, a metal silicide material 14 may be formed between the first dielectric material 140 and the polycrystalline material 13 of each of the high voltage region HV, the medium voltage region MV and the low voltage region LV. For instance, the metal silicide material 14 may include a first metal silicide material 114 included between the first dielectric material 140 and the first polycrystalline material 113, a second metal silicide material 124 included between the first dielectric material 140 and the second polycrystalline material 123, and a third metal silicide material 134 included between the first dielectric material 140 and the third polycrystalline material 133. The metal silicide material 14 is, for example, nickel silicide (NiSi), but the invention is not limited thereto.

Figure 1B:
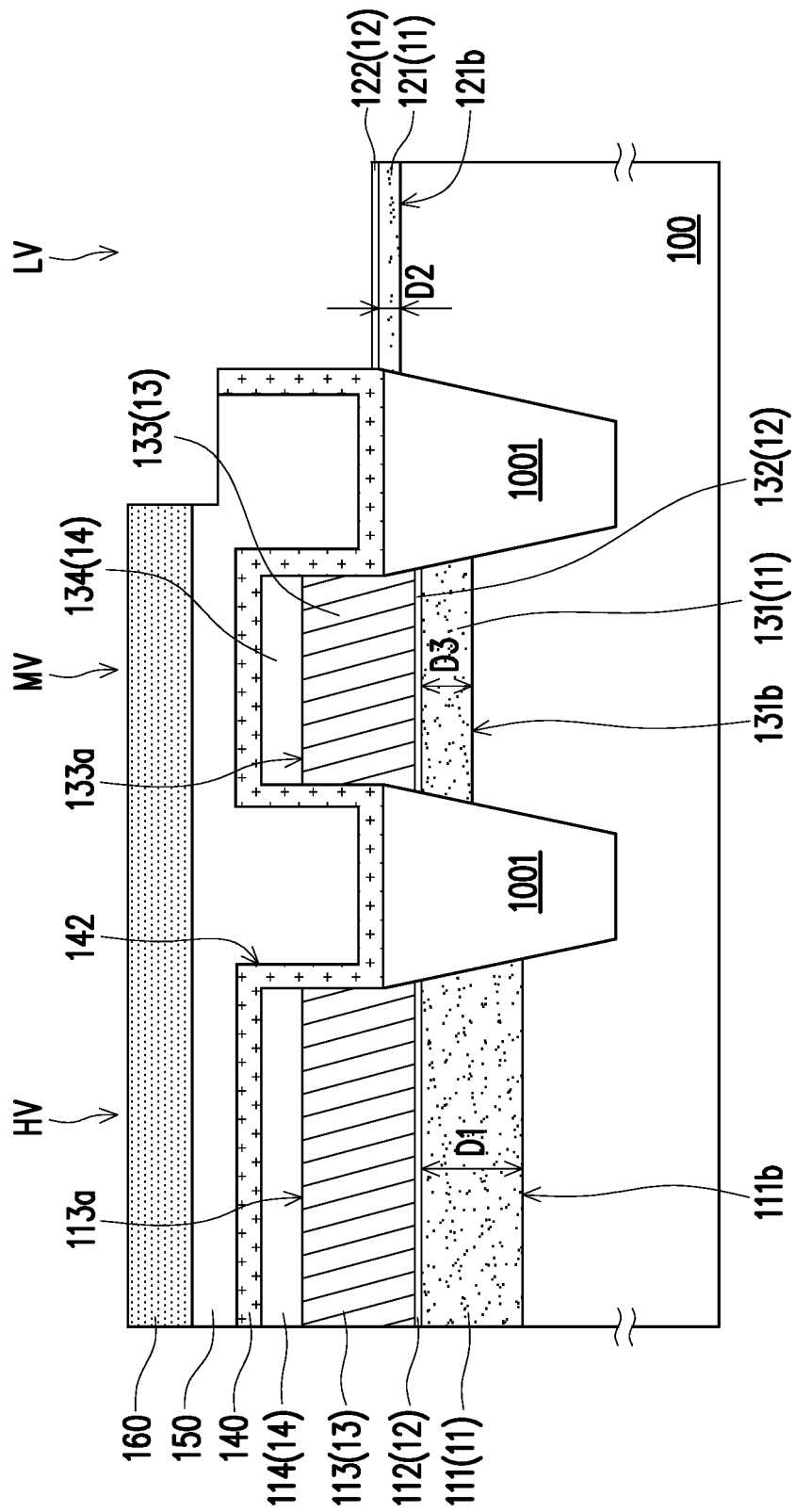

Referring to FIG. 1B, a mask material 160 is formed at least on the high voltage region HV to protect the first polycrystalline material 113 on the high voltage region HV so that the first polycrystalline material 113 will not be replaced with a metal gate in the subsequent process. The mask material 130 is, for example, a photoresist material.

In this embodiment, the mask material 160 may be formed on the high voltage region HV and the medium voltage region MV. In other words, it is possible that the mask material 160 is not formed on the low voltage region LV, but the invention is not limited thereto.

Continuing to refer to FIG. 1B, at least the second polycrystalline material 123 on the low voltage region VL is removed by the mask material 160. In this embodiment, only the second polycrystalline material 123 on the low voltage region VL is removed by the mask material 160. In other words, the first polycrystalline material 113 on the high voltage region HV and the third polycrystalline material 133 on the medium voltage region MV are not removed, but the invention is not limited thereto. On the other hand, the mask material 160 may extend to the adjacent isolation structure 1001 in a direction towards the low voltage region LV to prevent a lateral etching from occurring when an etching process is used to remove the third polycrystalline material 123 on the low voltage region LV. Accordingly, the second metal silicide material 124 on the second polycrystalline material 123 and a part of the first dielectric material 140 may be removed together to expose the second high dielectric material 122.

Figure 1C:
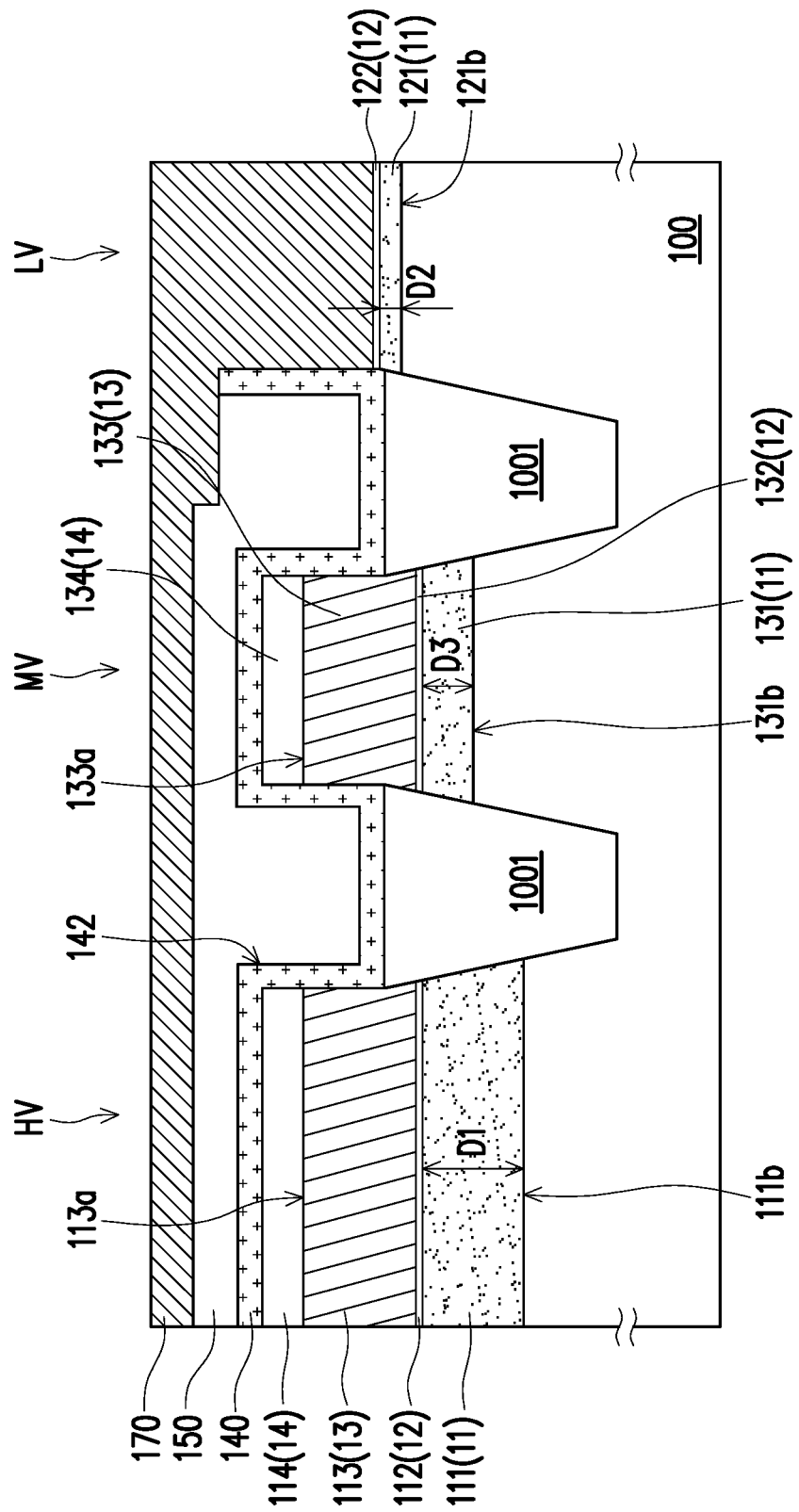
Figure 1D:
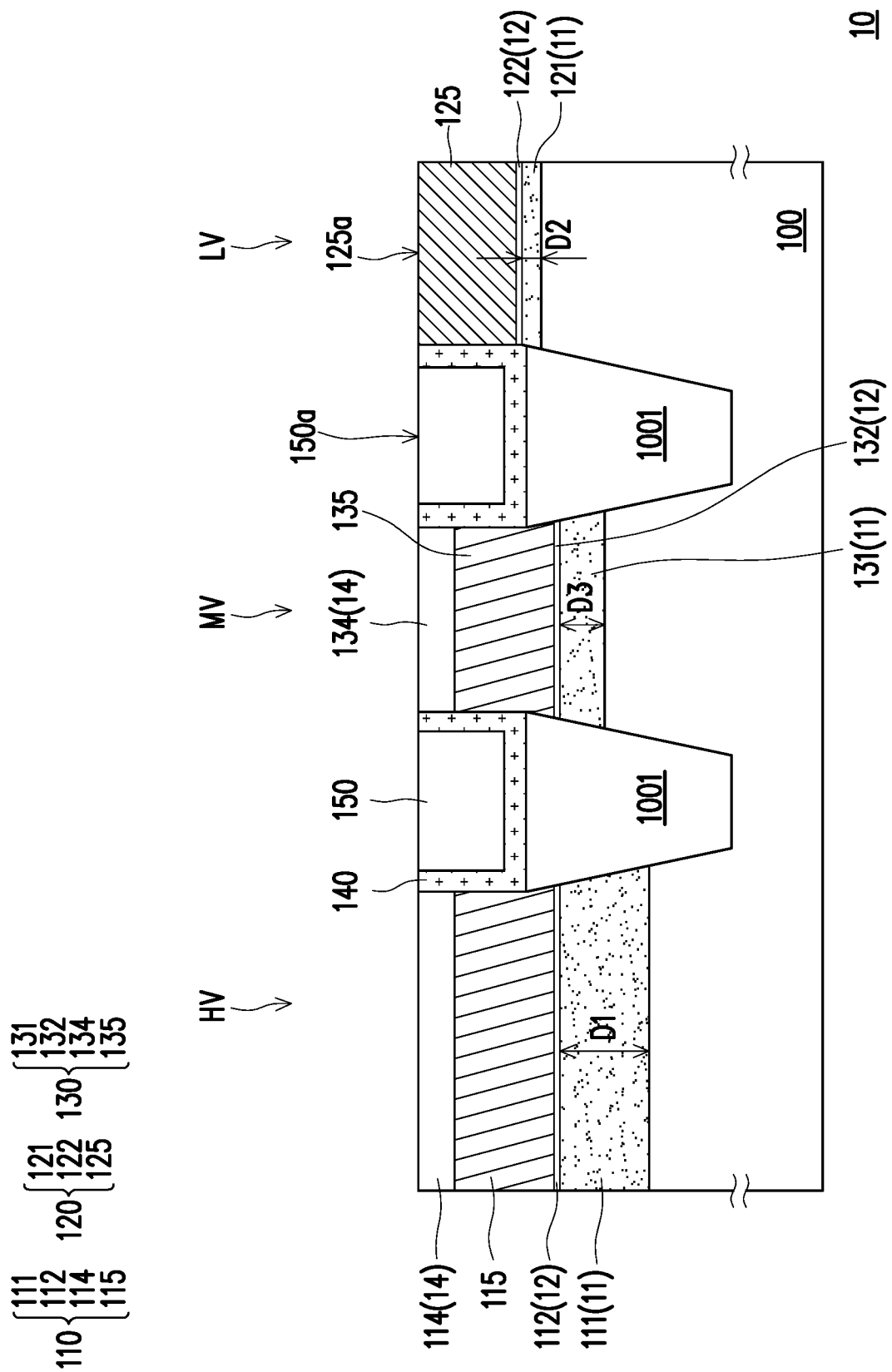

Referring to FIG. 1C and FIG. 1D together, the mask material 160 is removed and a metal material 170 is formed on the substrate 110. The metal material 170 is, for example, aluminum, but the invention is not limited thereto. Next, a planarization is performed on the metal material 170 to form a second gate 125 at least on the low voltage region LV. The second gate 125 is a metal gate. The planarization is, for example, chemical-mechanical polishing method. On the other hand, because the first polycrystalline material 113 on the high voltage region HV and the third polycrystalline material 133 on the medium voltage region MV are not removed, a first gate 115 constituted by the first polycrystalline material 113 on the high voltage region HV is a polycrystalline gate, and a third gate 135 constituted by the third polycrystalline material 133 on the medium voltage region MV is a polycrystalline gate, but the invention is not limited thereto.

Further, the first oxide layer 111, the first high dielectric constant material 112, the first gate 115 and the first metal silicide material 114 sequentially stacked on the high voltage region HV may constitute a first semiconductor element 110; the second oxide layer 121, the second high dielectric constant material 122 and the second gate 125 sequentially stacked on the low voltage region LV may constitute a second semiconductor element 120; the third oxide layer 131, the third high dielectric constant material 132, the third gate 135 and the third metal silicide material 134 sequentially stacked on the medium voltage region MV may constitute a third semiconductor element 130.

It should be noted that the invention does not limit compositions of the first semiconductor element 110, the second semiconductor element 120 and the third semiconductor element 130, and the existence of the third semiconductor element 130 is optional. As long as the first gate 115 in the first semiconductor element 110 is the polycrystalline gate and the second gate 125 in the second semiconductor element 120 is the metal gate, they all fall within the protection scope of the invention.

In one embodiment, a dielectric layer constituted by the second dielectric material 150 may be located between the first semiconductor element 110 and the second semiconductor element 120. In addition, a top surface 150a of the dielectric layer constituted by the second dielectric material 150 may be substantially coplanar with a top surface 125a of the second gate 125, but the invention is not limited thereto.

After the above processes, the fabrication of the integrated circuit 10 of this embodiment can be substantially completed. In this embodiment, for the semiconductor elements on the different voltage regions on the integrated circuit 10 having different operating voltage requirements, the gate material in the respective region can be selected correspondingly. For instance, the first gate 115 of the first semiconductor element 110 on the high voltage region HV may be the polycrystalline gate so that the first semiconductor element 110 has excellent component reliability. The second gate 125 of the second semiconductor element 120 on the low voltage region LV may be the metal gate so that the second semiconductor element 120 has excellent operating speed. Therefore, the integrated circuit 10 of the invention can meet the operating voltage requirements of the semiconductor elements on the different voltage regions to provide component diversity while maintaining certain performance. In addition, because the first gate 115 of the first semiconductor device 110 on the high voltage region HV is not the metal gate, the dishing problem caused by the planarization when the metal gate is formed may be solved.

Further, the mask material 160 may be formed to protect the first polycrystalline material 113 on the high voltage region HV, so that the first polycrystalline material 113 will not be replaced with the metal gate in the subsequent process to make the first gate 115 become the polycrystalline material, and the first gate 115 will not be cut into multiple blocks either. Therefore, the invention can solve the dishing problem on the first gate 115 of the high voltage region HV while maintaining component diversity, so as to maintain preferable electrical performance.

It should be noted that the reference numerals and a part of the contents in the above embodiment are also used to describe the following embodiment, in which the same reference numerals are used to represent identical or similar elements, and thus descriptions of the same technical contents are omitted. The omitted part of the description can refer to the foregoing embodiment, which is not repeated in the following embodiments.

FIG. 2A to FIG. 2D are partial cross-sectional views showing a manufacturing method of the oxide layer of FIG. 1A. FIG. 3A to FIG. 3G are partial cross-sectional views showing another manufacturing method of the oxide layer of FIG. 1A.

Referring to FIG. 2A to FIG. 2D together, in one embodiment, for example, the oxide layer 11 having different embedded depths in FIG. 1A is formed by the following steps.

Figure 2A:
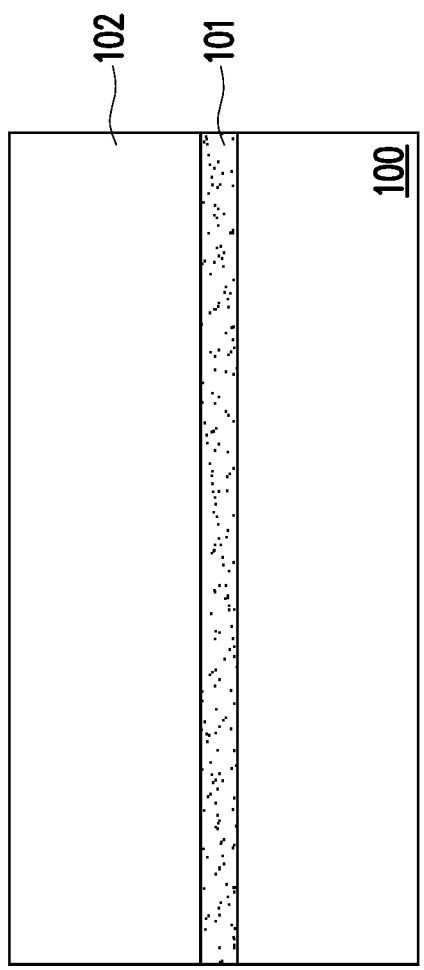
FIG. 2A to FIG. 2D are partial cross-sectional views showing a manufacturing method of the oxide layer of FIG. 1A.
Figure 2B:
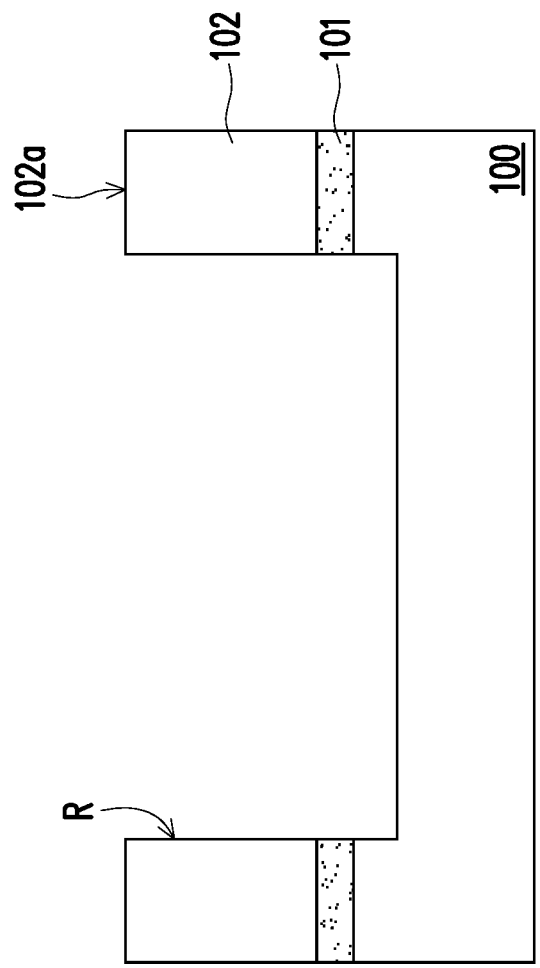
Figure 2C:
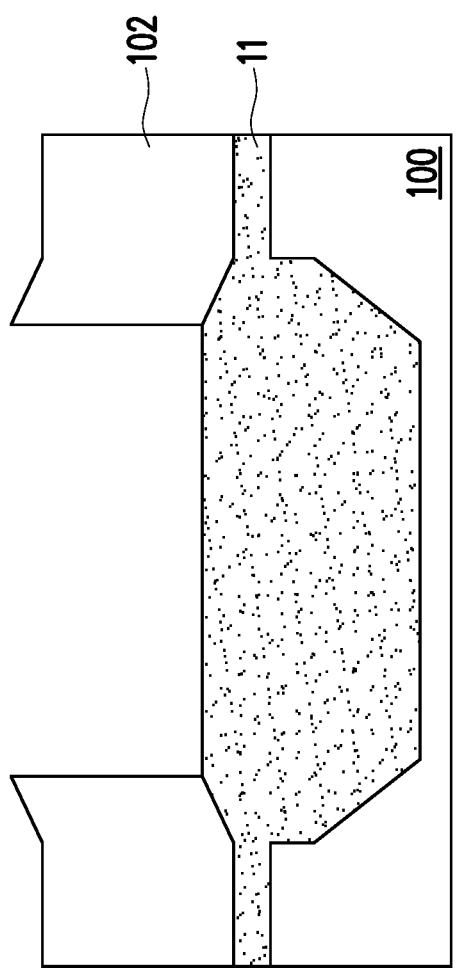
Figure 2D:
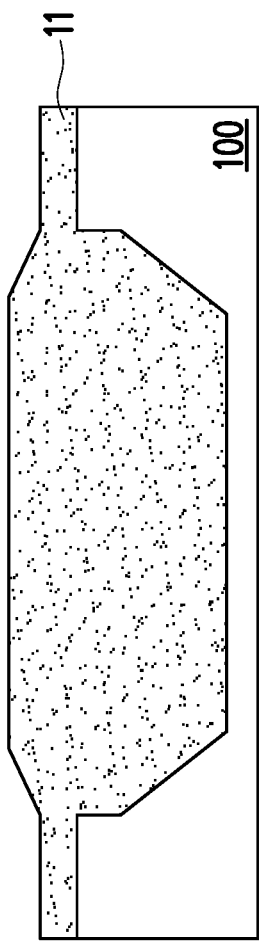

First, as shown in FIG. 2A, an oxide material layer 101 and a nitride material layer 102 are sequentially formed on the substrate 100. The oxide material layer 101 is, for example, silicon oxide, and the nitride material layer 102 is, for example, silicon nitride, but the invention is not limited thereto. Next, as shown in FIG. 2B, a part of the oxide material layer 101, the nitride material layer 102 and the substrate 100 may be removed by a lithography etching process to form a recess R penetrating and extending from a top surface 102a of the nitride material layer 102 to the substrate 100. Then, as shown in FIG. 2C, the oxide layer 11 may be formed in the recess R. A forming method of the oxide layer 11 is, for example, local oxidation of silicon (LOCOS) or dry oxidation (dry O$_2$). Then, as shown in FIG. 2D, the remaining nitride material layer 102 is removed.

Referring to FIG. 3A to FIG. 3G together, in another embodiment, for example, the oxide layer 11 having different embedded depths in FIG. 1A is formed by the following steps.

Figure 3A:
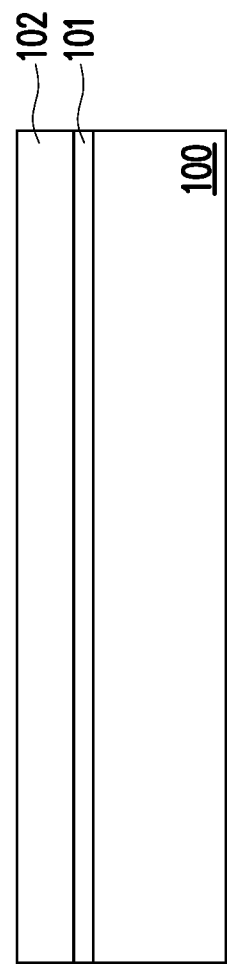
Figure 3B:
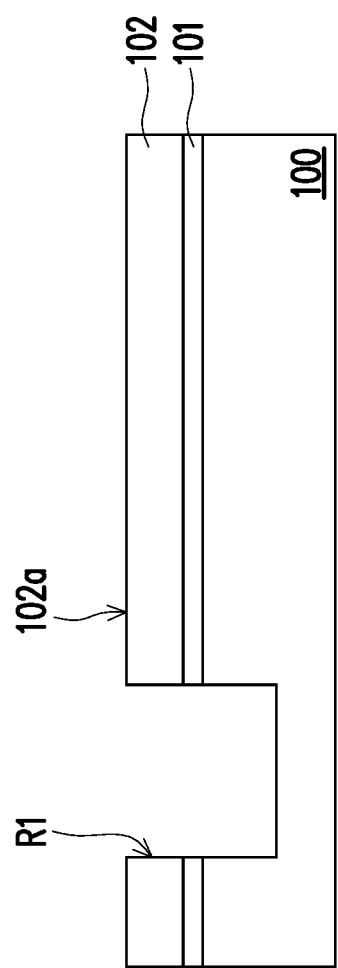
Figure 3C:
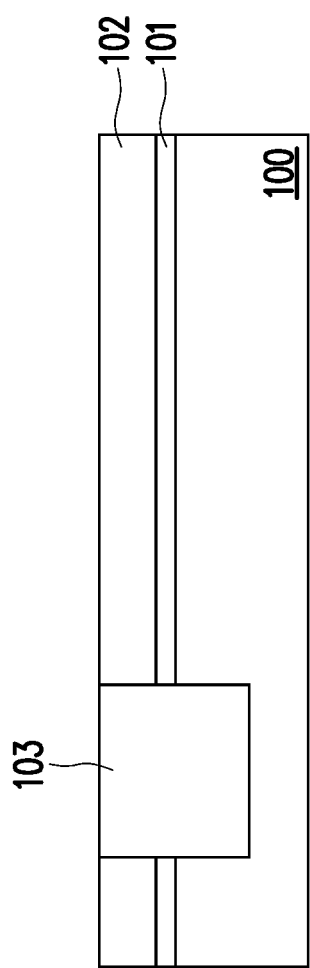

First, as shown in FIG. 3A, an oxide material layer 101 and a nitride material layer 102 are sequentially formed on the substrate 100. The oxide material layer 101 is, for example, silicon oxide, and the nitride material layer 102 is, for example, silicon nitride, but the invention is not limited thereto. Next, as shown in FIG. 3B, a part of the oxide material layer 101, the nitride material layer 102 and the substrate 100 may be removed by a lithography etching process to form a first recess R1 penetrating and extending from the top surface 102a of the nitride material layer 102 to the substrate 100. Then, as shown in FIG. 3C, a sacrificial layer 103 is formed in the first recess R1. A material of the sacrificial layer 103 is, for example, an organic filler (UL).

Figure 3E:
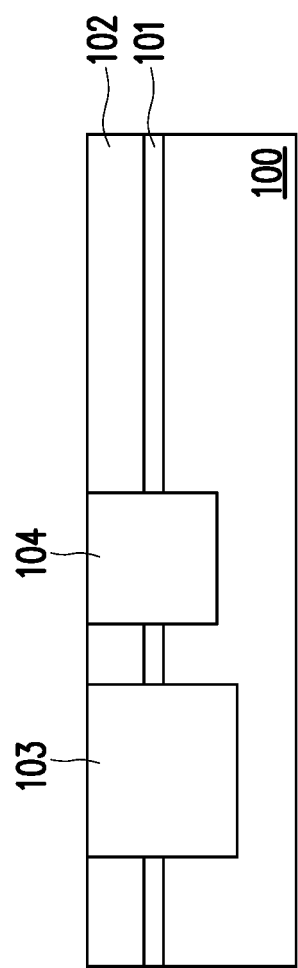

Then, as shown in FIG. 3D, another part of the oxide material layer 101, the nitride material layer 102 and the substrate 100 may be removed by the lithography etching process to form a second recess R2 penetrating and extending from the top surface 102a of the nitride material layer 102 to the substrate 100. A depth of the second recess R2 may be smaller than a depth of the first recess R1. Next, as shown in FIG. 3E, a sacrificial layer 104 is formed in the second recess R2. A material of the sacrificial layer 104 is, for example, an organic filler (UL).

Figure 3F:
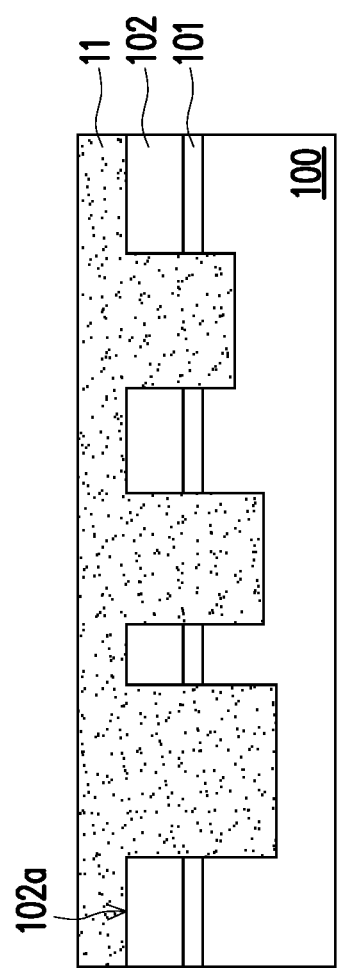
Figure 3G:
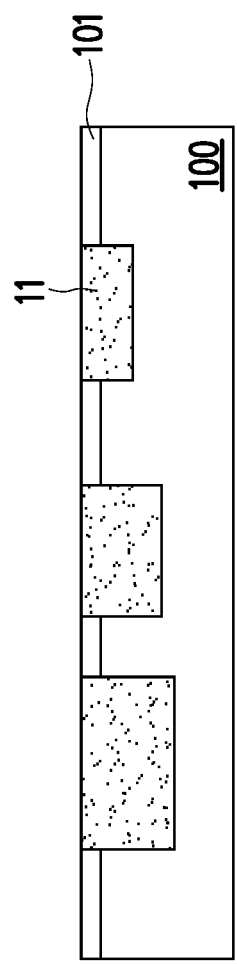

Next, as shown in FIG. 3F, the above steps can be repeated to form a recess having a different depth and form a sacrificial layer in the recess. After that, the sacrificial layers in all the recesses are removed, and then the oxide layer 11 is formed in the recesses having different depths. The oxide layer 11 may cover the top surface 102a of the nitride material layer 102. Then, as shown in FIG. 3G, a planarization is performed on the oxide layer 11 and the remaining nitride material layer 102 is removed. The oxide layer 11 formed this way has different embedded depths and is coplanar with the oxide material layer 101.

It should be noted that the invention does not limit the formation of the oxide layer 11 having different embedded depths to the foregoing manner, and different depths of the recesses may also be decided depending on actual design requirements.

Figure 4A:
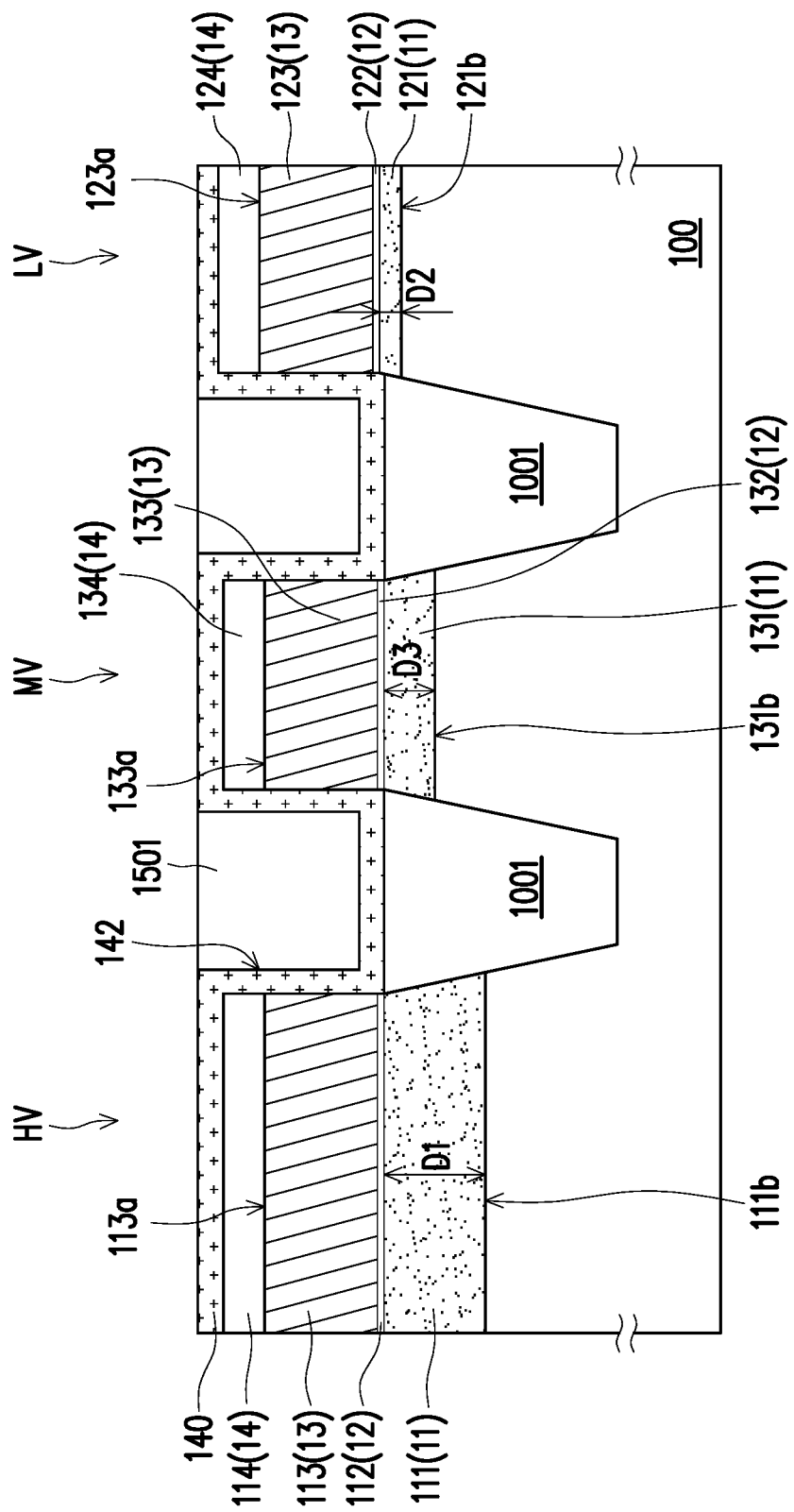
FIG. 4A to FIG. 4C are partial cross-sectional views showing a manufacturing method of parts of an integrated circuit according to another embodiment of the invention.
Figure 4B:
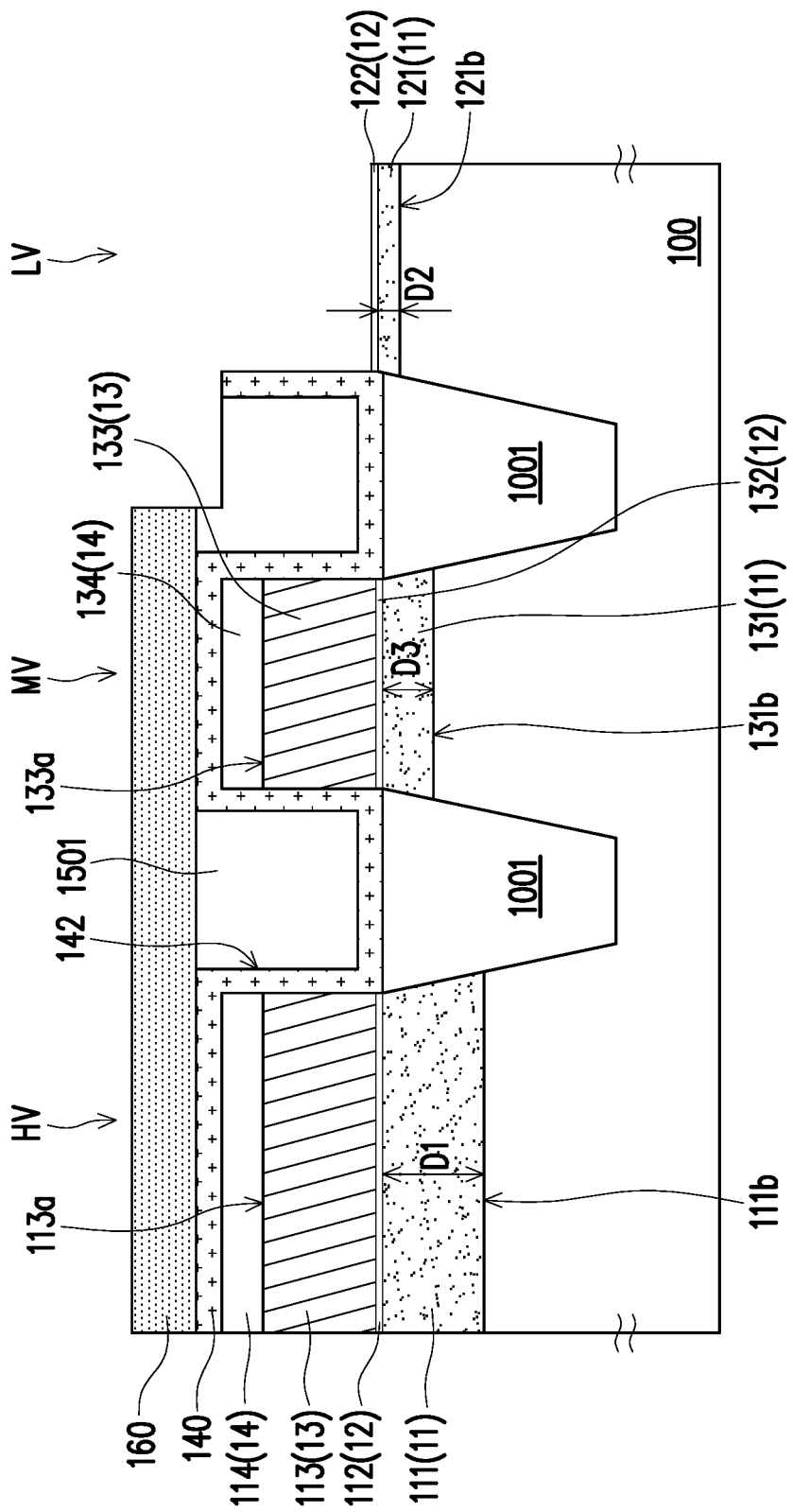
Figure 4C:
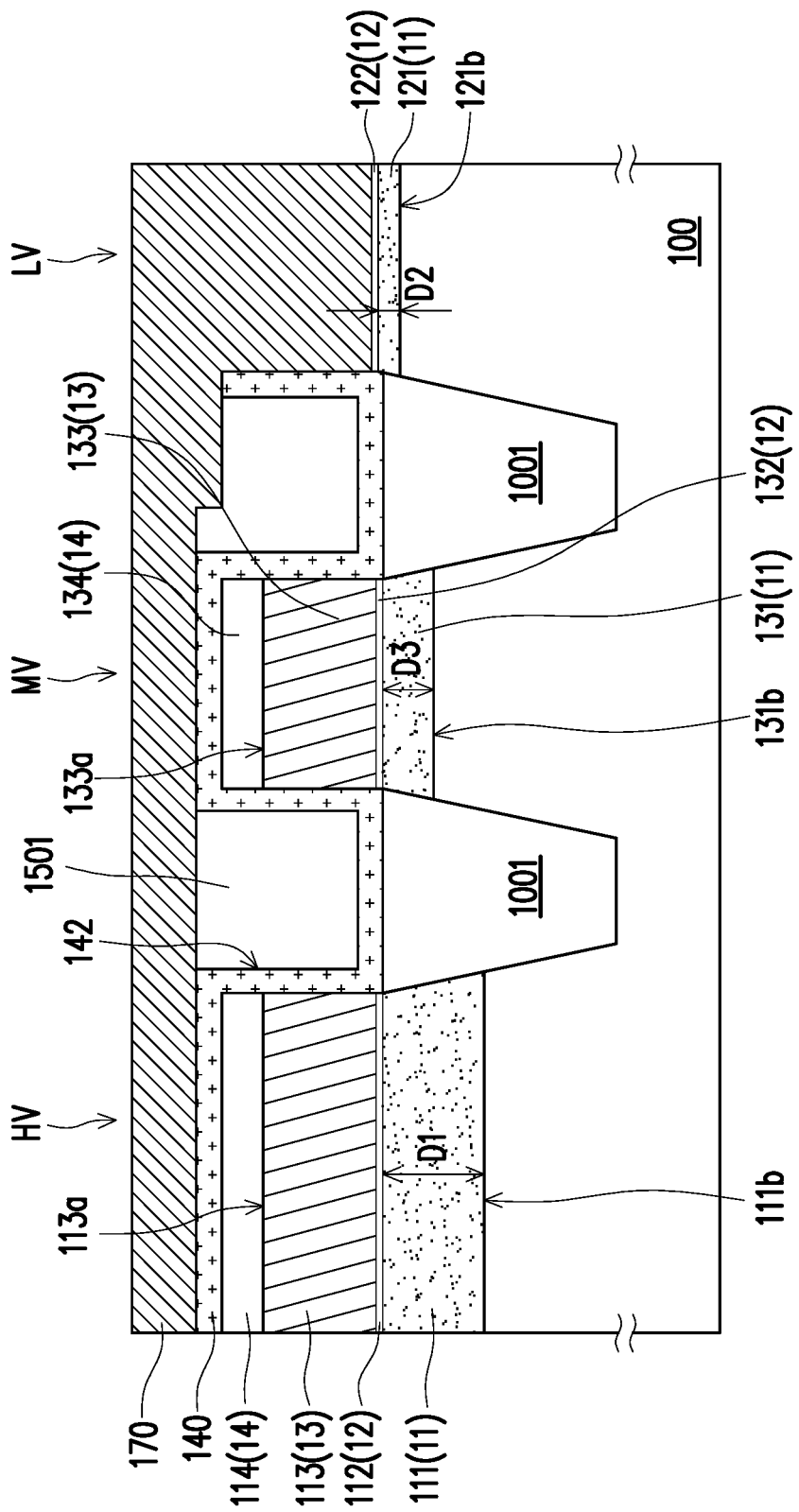

FIG. 4A to FIG. 4C are partial cross-sectional views showing a manufacturing method of parts of an integrated circuit according to another embodiment of the invention. In this embodiment, only steps that differ from the integrated circuit 10 of the embodiment of FIG. 1A to FIG. 1D are depicted. Similar components are denoted by the same reference numerals and have similar functions, materials or formation methods with their descriptions thereof omitted.

Referring to FIG. 4A, FIG. 4 is similar to FIG. 1A but differs in that the first dielectric material 140 on the high voltage region HV and the medium voltage region MV may be exposed. In other words, a second dielectric material 1501 does not cover the first dielectric material 140 on the high voltage region HV and the medium voltage region MV. More specifically, a top surface of the first dielectric material 140 on the high voltage region HV and the medium voltage region MV may be substantially coplanar with a top surface of the second dielectric material 1501.

Referring to FIG. 4B, FIG. 4B is similar to FIG. 1B but differs in that the mask material 160 may directly contact the first dielectric material 140 on the high voltage region HV and the medium voltage region MV. More specifically, since the second dielectric material 1501 does not cover the first dielectric material 140 on the high voltage region HV and the medium voltage region MV, the mask material 160 may be directly formed on the first dielectric material 140 on the high voltage region HV and the medium voltage region MV.

Referring to FIG. 4C, FIG. 4C is similar to FIG. 1C but differs in that the metal material 170 may directly contact the first dielectric material 140 on the high voltage region HV and the medium voltage region MV. Afterwards, the planarization may be performed on the metal material 170 to form the structure as shown in FIG. 1D, which will not be repeated here.

Figure 5A:
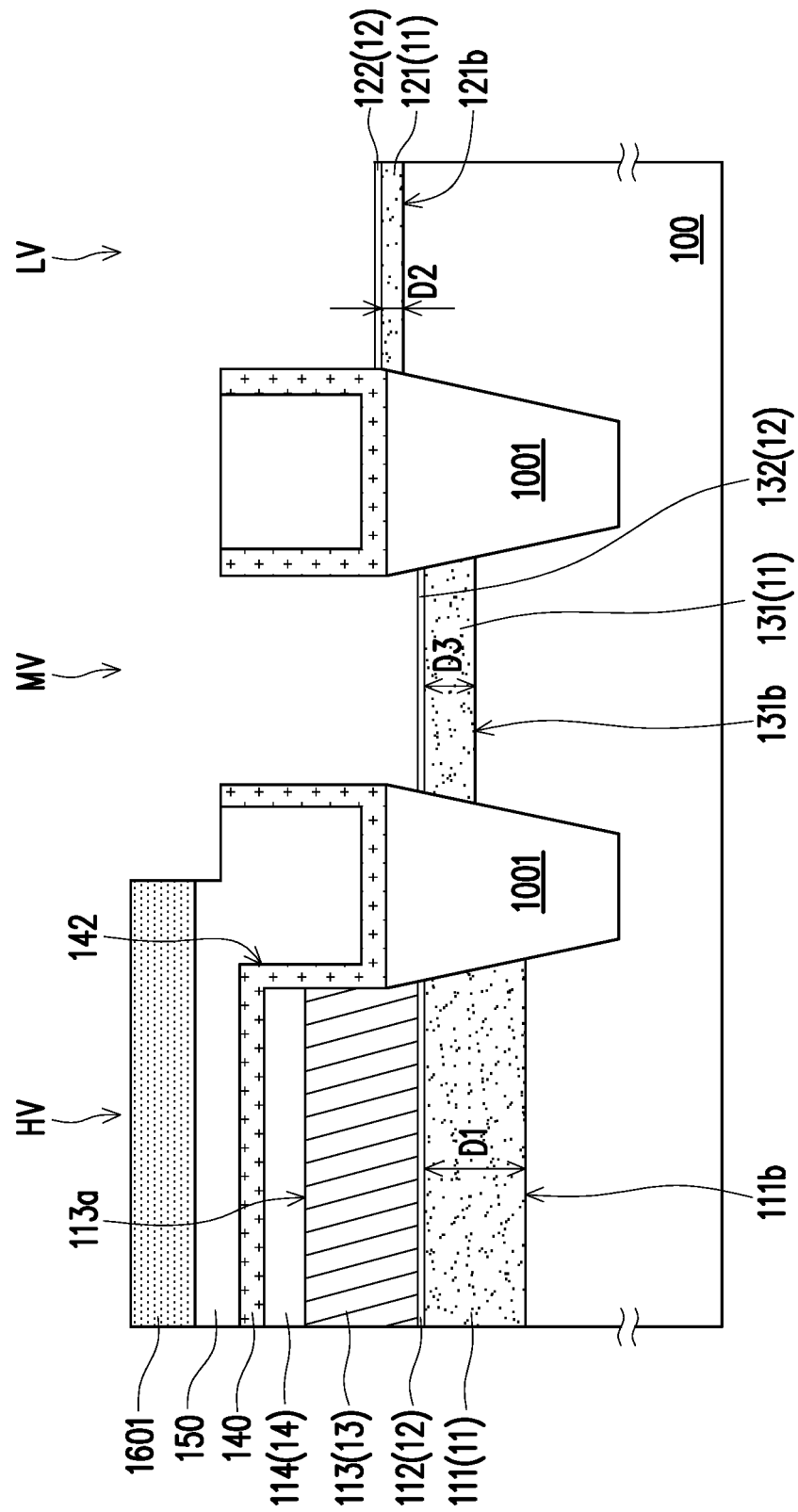
FIG. 5A to FIG. 5C are partial cross-sectional views showing a manufacturing method of parts of an integrated circuit according to yet another embodiment of the invention.
Figure 5B:
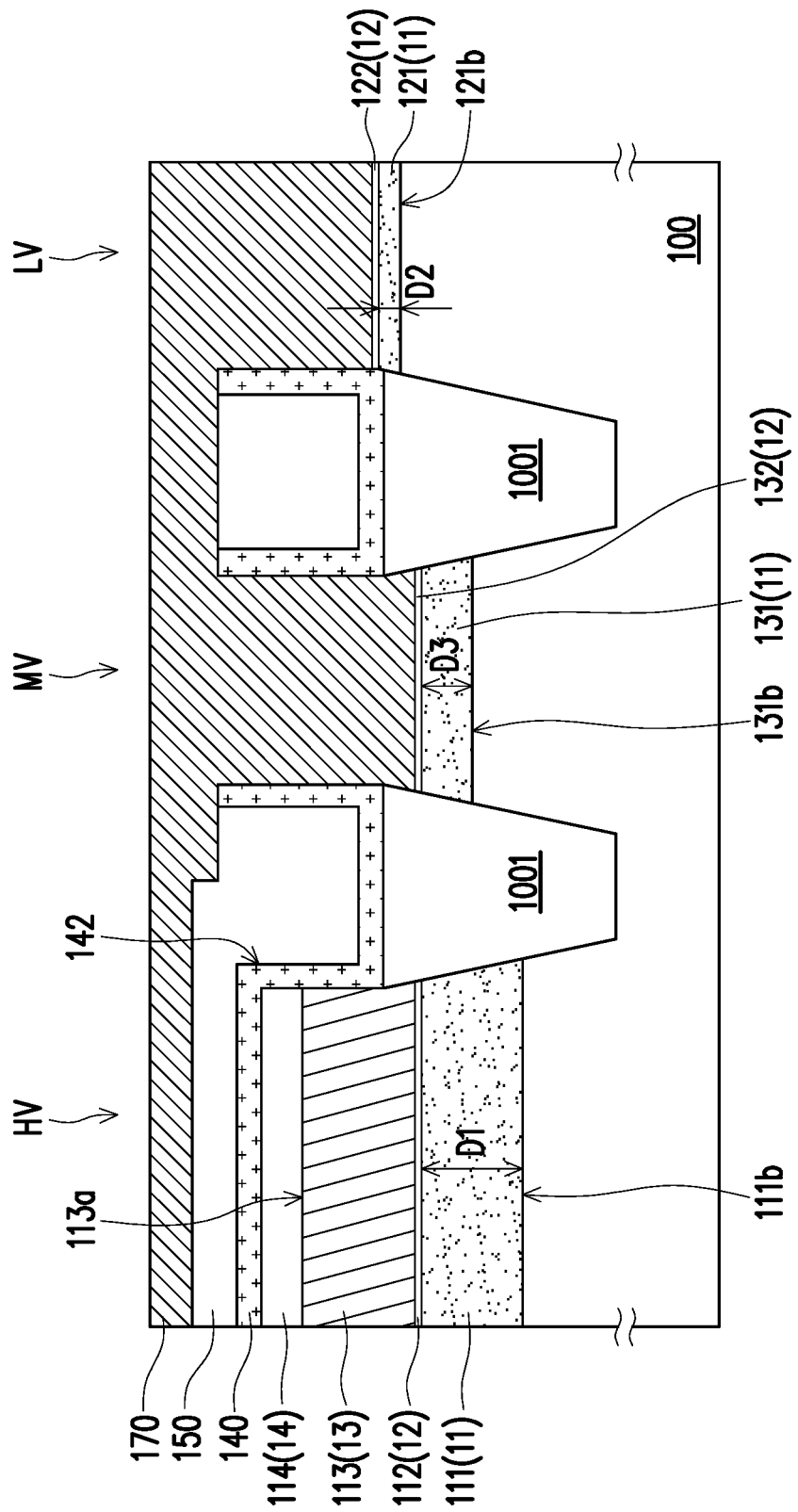
Figure 5C:
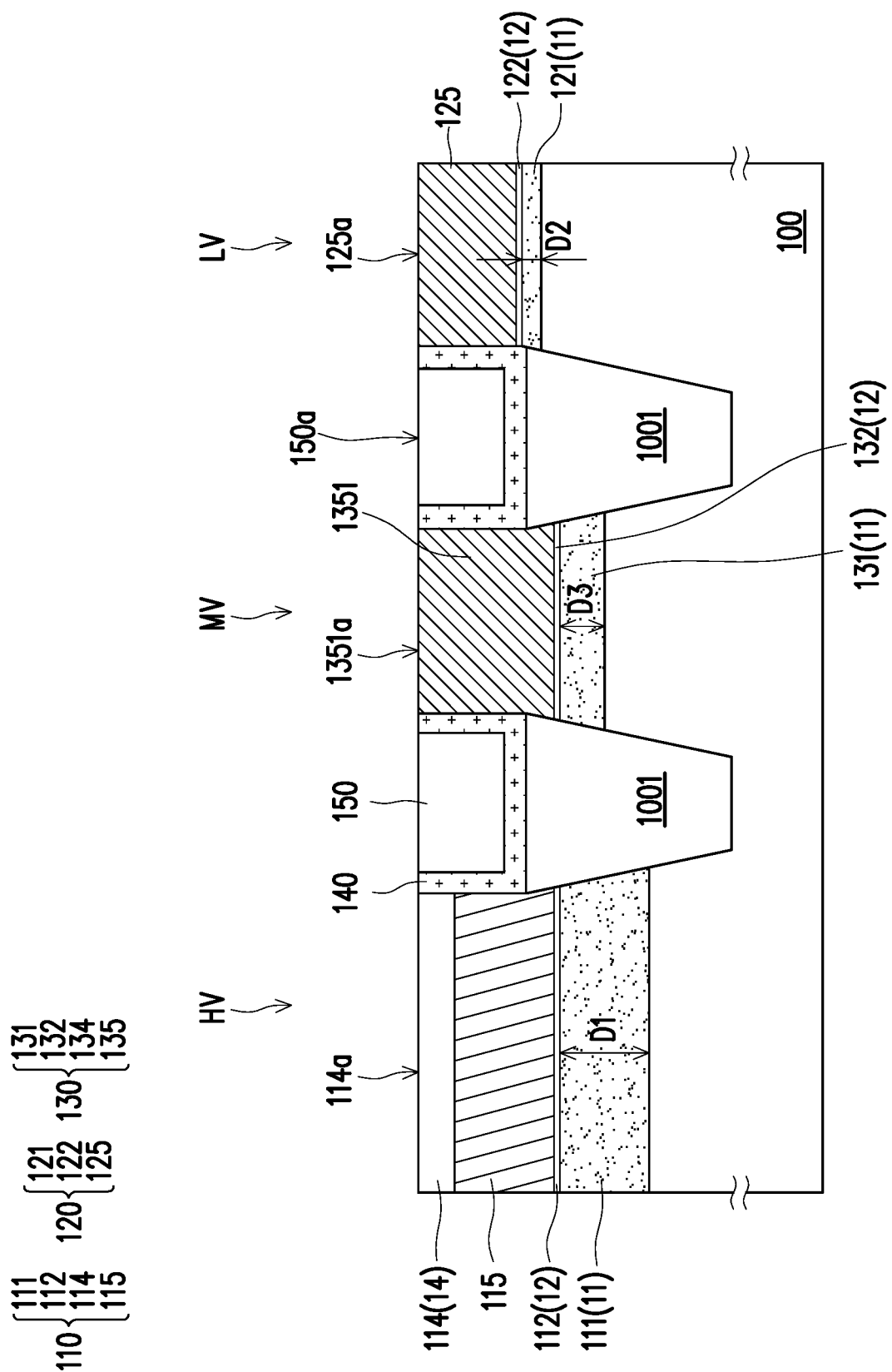
Figure 6A:
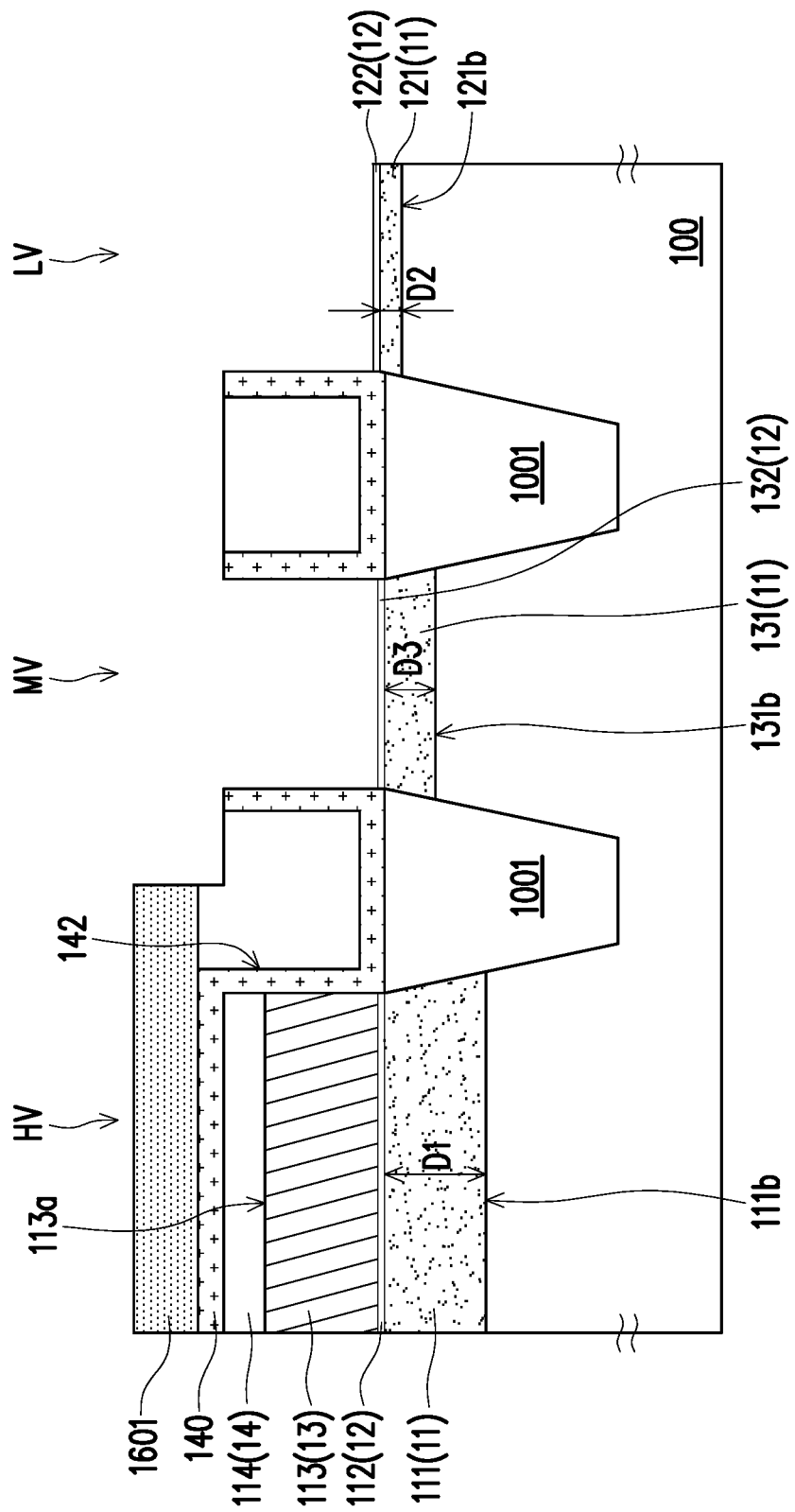
FIG. 6A and FIG. 6B are partial cross-sectional views showing a manufacturing method of parts of an integrated circuit according to still another embodiment of the invention.
Figure 6B:
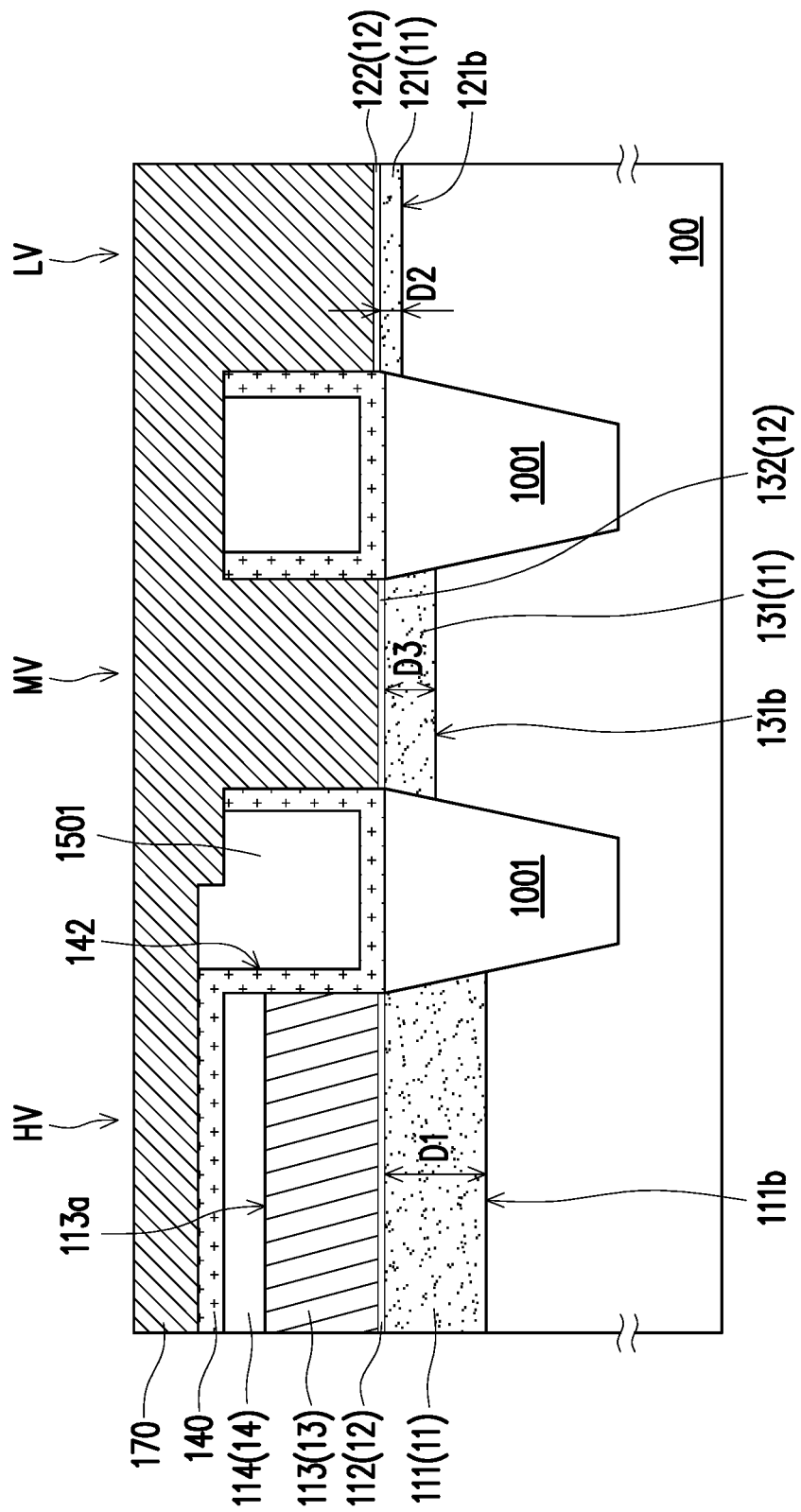

FIG. 5A to FIG. 5C are partial cross-sectional views showing a manufacturing method of parts of an integrated circuit according to yet another embodiment of the invention. FIG. 6A and FIG. 6B are partial cross-sectional views showing a manufacturing method of parts of an integrated circuit according to still another embodiment of the invention. It should be noted that FIG. 5A is a step following FIG. 1A, and FIG. 6A is a step following FIG. 4A. Similar components are denoted by the same reference numerals and have similar functions, materials or formation methods with their descriptions thereof omitted.

Referring to FIG. 5A and FIG. 6A together, FIG. 5A is similar to FIG. 1B, and FIG. 6A is similar to FIG. 4B. The difference is that a mask material 1601 may be formed only on the high voltage region HV. In other words, it is possible that the mask material 1601 is not formed on the medium voltage region MV and the low voltage region LV. Therefore, the third polycrystalline material 133 on the medium voltage region MV may also be removed by the mask material 1601 (as shown in FIG. 1A).

Referring to FIG. 5B and FIG. 6B together, FIG. 5B is similar to FIG. 1C, and FIG. 6B is similar to FIG. 4C. The difference is that the metal material 170 may be further filled into a space generated after the third polycrystalline material 133 on the medium voltage region MV is removed.

Referring to FIG. 5C, FIG. 5C is similar to FIG. 1D but differs in that a planarization is performed on the metal material 170 to further form a third gate 1351 on the medium voltage region MV. The third gate 1351 is a metal gate. In addition, when the third polycrystalline material 133 on the medium voltage region MV is removed, the third metal silicide material 134 thereon may be removed together. Therefore, in this embodiment, the top surface 125a of the second gate 125, a top surface 1351a of the third gate 1351 and a top surface 114a of the first metal silicide material 114 are substantially coplanar. On the other hand, after FIG. 6B, the above steps of FIG. 5C to FIG. 5D may be continued to form the structure as shown in FIG. 5D, which will not be repeated here.

In summary, according to the invention, for the semiconductor elements on the different voltage regions on the integrated circuit having different operating voltage requirements, the gate material in the respective region can be selected correspondingly. For instance, the first gate of the first semiconductor element on the high voltage region may be the polycrystalline gate so that the first semiconductor element has excellent component reliability. The second gate of the second semiconductor element on the low voltage region may be the metal gate so that the second semiconductor element has excellent operating speed. Therefore, the integrated circuit of the invention can meet the operating voltage requirements of the semiconductor elements on the different voltage regions to provide component diversity while maintaining certain performance. In addition, because the first gate of the first semiconductor device on the high voltage region is not the metal gate, the dishing problem caused by the planarization during the formation of the metal gate may be solved. Further, the mask material may be formed to protect the first polycrystalline material on the high voltage region, so that the first polycrystalline material will not be replaced with the metal gate in the subsequent process to make the first gate become the polycrystalline material, and the first gate will not be cut into multiple blocks either. Therefore, the invention can solve the dishing problem on the first gate of the high voltage region while maintaining component diversity, so as to maintain preferable electrical performance.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. An integrated circuit, comprising:
a substrate, having a high voltage region, a low voltage region separated from each other, and a medium voltage region separated from the high voltage region and the low voltage region;
a first semiconductor element, located in the high voltage region, wherein the first semiconductor element comprises:
a first oxide layer, embedded in the substrate; and
a first gate, located on the first oxide layer, wherein the first gate is a polycrystalline gate;
a second semiconductor element, located in the low voltage region, wherein the second semiconductor element comprises:
a second oxide layer, embedded in the substrate; and
a second gate, located on the second oxide layer, wherein the second gate is a metal gate; and
a third semiconductor element, located in the medium voltage region, wherein the third semiconductor element comprises:
a third oxide layer, embedded in the substrate; and
a third gate, located on the third oxide layer,
wherein a depth of the first oxide layer embedded in the substrate, a depth of the second oxide layer embedded in the substrate and a depth of the third oxide layer are different.

2. The integrated circuit of claim 1, wherein the third gate is a polycrystalline gate or a metal gate.

3. The integrated circuit of claim 1, wherein a depth of the first oxide layer embedded in the substrate, a depth of the second oxide layer embedded in the substrate and a depth of the third oxide layer gradually decrease in sequence.

4. The integrated circuit of claim 1, wherein a bottom surface of the first oxide layer is lower than a bottom surface of the third oxide layer, and the bottom surface of the third oxide layer is lower than a bottom surface of the second oxide layer.

5. The integrated circuit of claim 1, wherein a top surface of the first gate and a top surface of the third gate are substantially coplanar and lower than a top surface of the second gate.

6. The integrated circuit of claim 1, wherein a top surface of the first oxide layer, a top surface of the second oxide layer and a top surface of the third oxide layer are coplanar.

7. The integrated circuit of claim 1, further comprising a plurality of dielectric layers, located between the first semiconductor element and the second semiconductor element, wherein top surfaces of the plurality of dielectric layers and a top surface of the second gate are substantially coplanar.

8. A manufacturing method of an integrated circuit, comprising:
providing a substrate, wherein the substrate has a high voltage region, a medium voltage region and a low voltage region separated from each other;
forming an oxide layer on each of the high voltage region, the medium voltage region and the low voltage region, wherein the oxide layer is embedded in the substrate;
forming a polycrystalline material on the oxide layer of each of the high voltage region, the medium voltage region and the low voltage region;
forming a mask material at least on the high voltage region;
removing at least the polycrystalline material on the low voltage region by the mask material;
removing the mask material;
forming a metal material on the substrate; and
performing a planarization on the metal material to form a metal gate at least on the low voltage region.

9. The manufacturing method of the integrated circuit of claim 8, wherein the mask material is formed only on the high voltage region.

10. The manufacturing method of the integrated circuit of claim 9, wherein removing the polycrystalline material on the medium voltage region by the mask material.

11. The manufacturing method of the integrated circuit of claim 8, wherein the mask material is formed on the high voltage region and the medium voltage region.

12. The manufacturing method of the integrated circuit of claim 11, wherein removing only the polycrystalline material on the low voltage region by the mask material.

13. The manufacturing method of the integrated circuit of claim 8, wherein:
the substrate comprises a plurality of isolation structures for separating the high voltage region, the medium voltage region and the low voltage region from each other; and
the mask material extends to the adjacent isolation structure in a direction towards to the low voltage region.

14. The manufacturing method of the integrated circuit of claim 8, wherein between the steps of forming the polycrystalline material and forming the mask material, the manufacturing method further comprises:
forming a first dielectric material on the substrate to cover the polycrystalline material on the high voltage region, the medium voltage region and the low voltage region, wherein the first dielectric material has a plurality of openings; and
forming a second dielectric material in the plurality of openings.

15. The manufacturing method of the integrated circuit of claim 14, wherein the second dielectric material covers the first dielectric material on the high voltage region.

16. The manufacturing method of the integrated circuit of claim 14, wherein the first dielectric material on the high voltage region is exposed.

17. The manufacturing method of the integrated circuit of claim 8, wherein the step of forming the oxide layer comprises:
sequentially forming an oxide material layer and a nitride material layer on the substrate;
removing a part of the oxide material layer, the nitride material layer and the substrate by a lithography etching process to form a recess penetrating and extending from a top surface of the nitride material layer to the substrate; and
forming the oxide layer in the recess.

18. The manufacturing method of the integrated circuit of claim 17, wherein the step of forming the oxide layer further comprises:
forming a sacrificial layer in the recess; and
forming the oxide layer in the recess after the sacrificial layer is removed.

* * * * *